(12) United States Patent
Wu

(10) Patent No.: US 6,914,299 B2
(45) Date of Patent: Jul. 5, 2005

(54) HORIZONTAL SURROUNDING GATE MOSFETS

(75) Inventor: Chung-Cheng Wu, Hsin-Chu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 10/437,092

(22) Filed: May 13, 2003

(65) Prior Publication Data

US 2004/0051150 A1 Mar. 18, 2004

Related U.S. Application Data

(62) Division of application No. 10/246,251, filed on Sep. 18, 2002, now Pat. No. 6,583,014.

(51) Int. Cl.⁷ .......... H01L 27/01; H01L 27/12; H01L 29/76; H01L 29/94; H01L 31/0392

(52) U.S. Cl. .......... 257/347; 257/350; 257/353; 257/401

(58) Field of Search .......... 257/347–354, 257/401

(56) References Cited

U.S. PATENT DOCUMENTS

| | | | |
|---|---|---|---|
| 5,162,250 A | 11/1992 | Clark | 437/52 |
| 5,192,704 A | 3/1993 | McDavid et al. | 437/52 |
| 5,304,836 A * | 4/1994 | Lao et al. | 257/399 |
| 5,414,289 A * | 5/1995 | Fitch et al. | 257/329 |
| 6,117,724 A * | 9/2000 | Cho | 438/239 |
| 6,127,209 A * | 10/2000 | Maeda et al. | 438/151 |
| 6,204,115 B1 | 3/2001 | Cho | 438/253 |
| 6,211,558 B1 * | 4/2001 | Ismail et al. | 257/419 |
| 6,383,860 B2 * | 5/2002 | Maeda et al. | 438/239 |
| 6,384,456 B1 * | 5/2002 | Tihanyi | 257/401 |
| 6,458,633 B1 * | 10/2002 | Cho | 438/149 |
| 6,583,014 B1 * | 6/2003 | Wu | 438/284 |
| 2002/0117659 A1 * | 8/2002 | Lieber et al. | 257/14 |
| 2002/0187648 A1 * | 12/2002 | Wu et al. | 438/745 |
| 2003/0173617 A1 * | 9/2003 | Sato et al. | 257/327 |

* cited by examiner

Primary Examiner—George Eckert
Assistant Examiner—Jesse A. Fenty
(74) Attorney, Agent, or Firm—Thomas, Kayden, Horstmeyer & Risley

(57) ABSTRACT

A horizontal surrounding gate MOSFET comprises a monolithic structure formed in an upper silicon layer of a semiconductor substrate which is essentially a silicon-on-insulator (SOI) wafer, the monolithic structure comprising a source and drain portion oppositely disposed on either end of a cylindrical channel region longitudinally disposed between the source and drain. The channel is covered with a gate dielectric and an annular gate electrode is formed circumferentially covering the channel.

5 Claims, 4 Drawing Sheets

HORIZONTAL SURROUNDING GATE MOSFETS

This is a division of U.S. patent application Ser. No. 10/246,251, filing date Sep. 18, 2002, now U.S. Pat. No. 6,583,014 Horizontal Surrounding Gate Mosfets, assigned to the same assignee as the present invention.

BACKGROUND OF THE INVENTION

1. Field of the Invention

This invention relates generally to the field of integrated microelectronics devices and, more specifically, to the formation of horizontal surrounding gate MOSFETs, devices having gate electrodes that surround a horizontal channel structure.

2. Description of the Related Art

The gate electrode of the typical metal-oxide-silicon field effect transistor (MOSFET) is formed on the planar surface of a dielectric layer over a doped channel within the mono-crystalline semiconductor substrate beneath the dielectric layer. Well known in the prior art, such a planar MOSFET is shown schematically in FIG. 1 and will be discussed below. The requirements of microelectronics integrated circuitry make other MOSFET geometries advantageous. McDavid et al. (U.S. Pat. No. 5,192,704) teach a method of forming a MOSFET having a vertical cylindrical channel with a gate electrode that surrounds the channel circumferentially. Such a vertical surrounding gate MOSFET, which McDavid et al. term a "filament channel transistor," allows vertical stacking of transistors and storage capacitors to form densely packaged DRAM circuits. Cho (U.S. Pat. No. 6,204,115 B1) also teaches the formation of a vertical channel MOSFET, called by Cho a "pillar transistor" disposed above a storage capacitor in a DRAM circuit. Clark (U.S. Pat. No. 5,162,250) also teaches the formation of a vertical filament or "pillar" transistor in conjunction with densely packed DRAM elements. FIG. 2, which will be discussed below, is a simplified schematic drawing of a vertical channel pillar or filament type MOSFET transistor. As is discussed in the prior art cited above, the formation of such vertical channel transistors presents difficulties as a result of the fact that the channel must be formed outside of the mono-crystalline semiconductor substrate, usually of amorphous or polycrystalline material. This not only presents problems with current leakage in polycrystalline material, but also with the formation of interconnections between the transistor and devices formed within the substrate. However, the surrounding gate electrode has the advantageous property that it can induce a complete inversion of the channel material.

The prior art does not teach the formation of a horizontal surrounding gate MOSFET, which is a geometrical formation in which the gate circumferentially surrounds a cylindrical channel but the channel is horizontally disposed between a source and a drain region. Such a MOSFET structure retains the benefits of a surrounding gate electrode, but lacks the difficult fabrication process associated with vertical channel structures.

SUMMARY OF THE INVENTION

The object of this invention is to provide a method for forming a horizontal surrounding gate MOSFET.

In accord with this object, a horizontal cylindrical channel is formed between a source and drain region disposed on a dielectric (typically an oxide) covered substrate. The formation preferentially begins with a silicon-on-insulator (SOI) wafer and the channel, source and drain region are formed monolithically from an upper silicon layer of the SOI wafer. An isotropic etch of the oxide allows the channel to be suspended above the oxide surface while remaining connected to the source and drain. A gate dielectric is then formed over the surface of the cylindrical channel and a gate electrode is then formed circumferentially over the gate dielectric.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENTS

The preferred embodiments of the present invention provide methods for forming a horizontal surrounding gate MOSFET.

Figure 1:
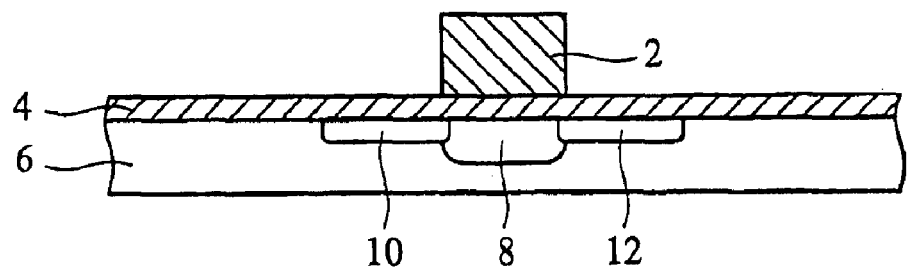
FIG. 1 is a schematic cross-sectional view of a typical prior art MOSFET having a planar gate electrode and a channel region within a mono-crystalline semiconductor substrate.

Referring first to FIG. 1, there is shown a prior art MOSFET in which the gate electrode (2) is deposited on a gate dielectric layer (4) which is itself formed on a monocrystalline substrate (6), typically silicon. A channel region (8) is formed within the monocrystalline substrate between source (10) and drain (12) regions, also formed within the substrate.

Figure 2:
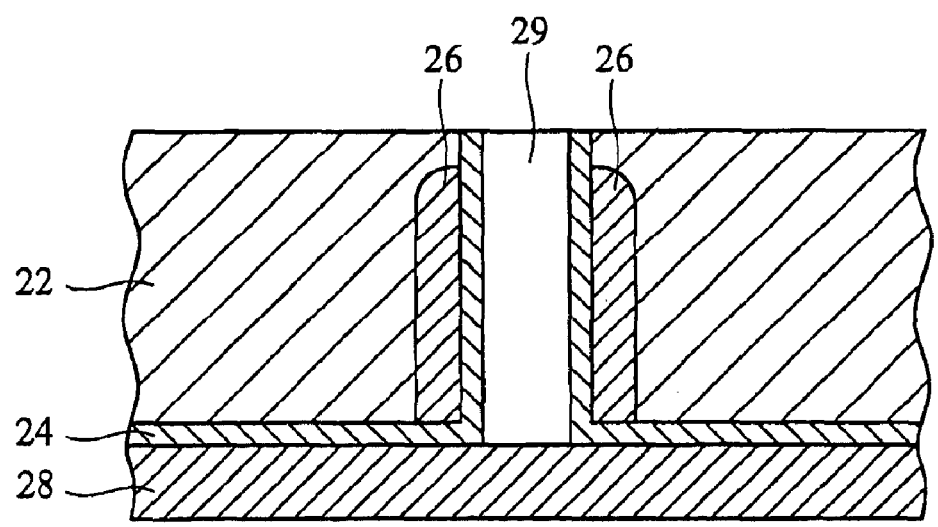
FIG. 2 is a schematic cross-sectional view of a prior art vertical channel MOSFET.

Referring next to FIG. 2, there is shown a prior art vertical surrounding gate MOSFET, such as is used to charge and access a storage capacitor in a DRAM fabrication. The polycrystalline channel (29) extends vertically through a thick oxide layer (22). The channel is surrounded by a gate oxide (24). A conducting gate electrode (26), which could be a wordline in a DRAM fabrication, surrounds the channel and oxide circumferentially. A conducting access layer (28), which could be a bitline, contacts the lower surface of the channel.

Figure 3:
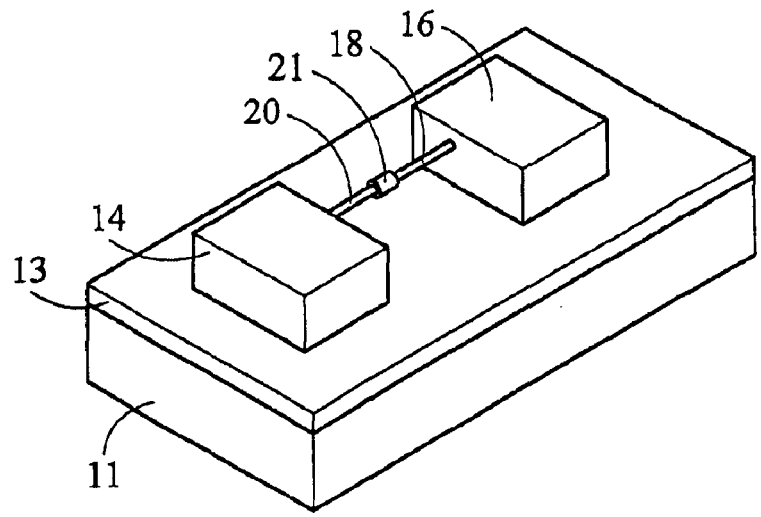
FIG. 3 is a schematic perspective view of the geometry of the horizontal surrounding gate MOSFET of the present invention.

Referring next to FIG. 3, there is shown a schematic perspective drawing of the horizontal surrounding gate electrode MOSFET of the present invention which is formed from a silicon-on-insulator (SOI) wafer. The individual process steps producing this configuration will be described below. There is seen a substrate (11), which would typically be a mono-crystalline silicon substrate, over which is formed a dielectric layer (13), which would typically be a layer of Sio.sub.2. A source (14), drain (16) and interconnecting cylindrical channel (18) are formed as a monolithic structure on the dielectric layer, the three elements being formed from a single silicon layer of the SOI wafer, of initial thickness between approximately 20 and 2000 angstroms, which was masked and etched to define the source, drain and channel regions. Although the channel (18) is not initially cylindrical in shape, it is given a substantially cylindrical form by a method described below. Subsequent to shaping, the channel is covered by a gate dielectric (20) which, in the preferred embodiment is a layer of $SiO_2$ grown on the channel or deposited by chemical-vapor deposition (CVD). Finally, an annular gate electrode (21) is formed on the channel dielectric surface, circumferentially surrounding the cylinder but not enclosing its entire width.

Figure 4A:
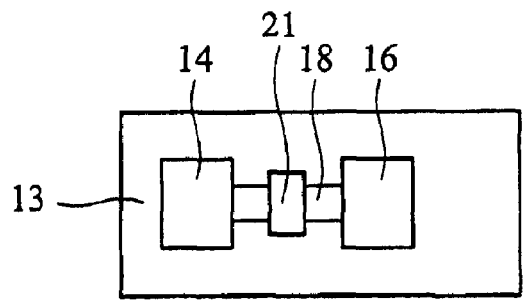
FIGS. 4a & b are schematic overhead views of the horizontal surrounding gate MOSFET, with FIG. 4a showing an embodiment in which the gate electrode is either unsupported or resting on the dielectric layer covering the substrate and FIG. 4b showing an embodiment in which the gate electrode is supported by an adjacent island or pedestal.
Figure 4B:
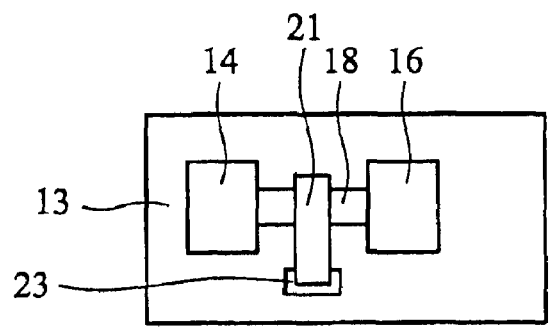

Referring next to FIG. 4a, there is shown an overhead schematic view of the fabrication in FIG. 3 with identical numerical labels referring to identical structures. In this version of the preferred embodiment, the gate electrode (22) is an annulus surrounding the channel (18). The electrode may be suspended above the dielectric (12) covering the substrate, or it may rest on the dielectric. In FIG. 4b, there is shown an alternative version in which the gate electrode (21) extends away from the channel and is supported by a silicon island (23) or pedestal. The choice of electrode configurations depends on the manner in which connections to the electrode are to be made.

Figure 5A:
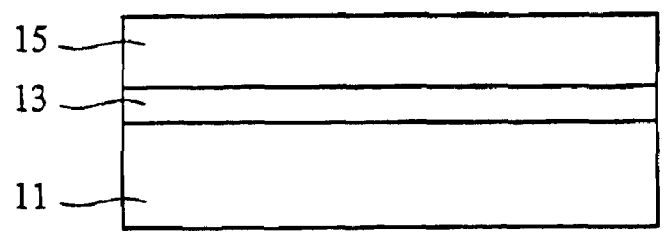
FIGS. 5a, b, 6–9 illustrate the process steps used in forming the horizontal surrounding gate MOSFET.

Referring to FIG. 5a there is shown a cross-section of a silicon-on-insulator (SOI) wafer comprising a crystalline silicon substrate (11) on which is formed a dielectric layer (13), which would be a layer of silicon dioxide in this embodiment, upon which is formed a layer of crystalline silicon (15).

Figure 5B:
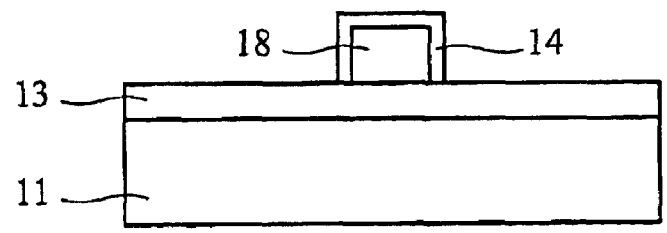

Referring next to FIG. 5b, there is shown a schematic cross-sectional view of a process step on the SOI wafer of FIG. 5a leading to the completed fabrication of FIG. 3. There is seen in FIG. 5b the silicon substrate (11), the $SiO_2$ oxide layer (13) and a section through the silicon channel (18) region which has been formed from the silicon layer (15) of FIG. 5a. The source region (14), also formed from layer (15) of FIG. 5a, is also shown, although it is behind the cross-sectional plane of the figure. The drain region would be in front of the plane and is not indicated. The source (14), drain (not shown) and channel (18) are defined and formed by a mask and etch process (not shown) from the silicon layer ((15) in FIG. 5a) of the SOI wafer. It is further noted that source, drain and channel regions can be doped during this process using similar processes as applied to the formation of conventional CMOS prior art devices.

Figure 6:
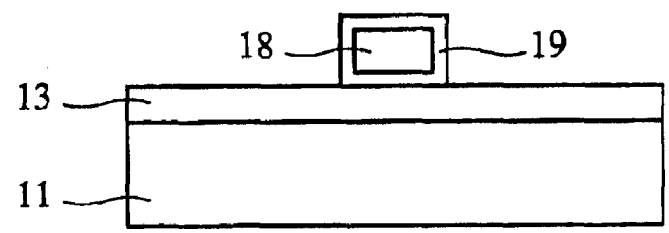

Referring next to FIG. 6, there is shown the fabrication of FIG. 5b subsequent to an isotropic oxide etch, such as an HF dip. The etch reduces the thickness of the oxide layer (13) beneath the channel, leaving it suspended above the oxide and supported by the source (14) and drain (not shown) regions. Masking is not required for this etch step because the source and drain regions are significantly thicker than the channel region. Note that the following figures will eliminate the depiction of the source region (14) for purposes of clarity.

Figure 7:
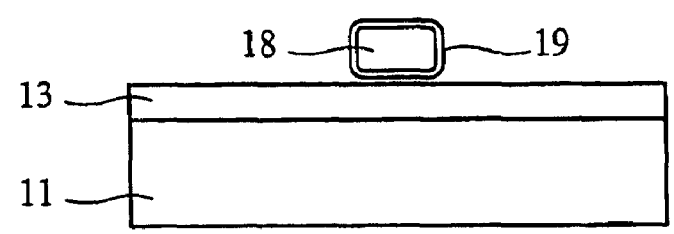

Referring next to FIG. 7, there is shown a schematic cross-sectional view of the fabrication in FIG. 6, subsequent to a process step to smooth the sharp corners of the channel region (18) and produce a substantially cylindrical cross-section. In this step, a sacrificial oxide layer (19) is deposited by thermal growth to a thickness between approximately 30 and 100 angstroms on the channel and then partially removed to produce the rounding. Layer (19) will not be indicated in subsequent figures. The deposition and removal process requires masking and the channel region and etching away the oxide.

Figure 8:
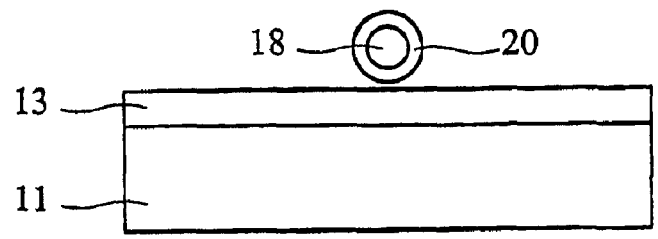

Referring now to FIG. 8, there is shown a schematic cross-sectional view of the fabrication of FIG. 7 subsequent to the formation of a gate dielectric layer (20) over the channel (18). The gate dielectric can be thermally grown or deposited by CVD on the channel surface. In this preferred embodiment, the gate dielectric is a layer of $SiO_2$ that is formed to a thickness of between approximately 8 and 100 angstroms. Although the cross-section of the dielectric covered channel may not be perfectly circular, it is substantially so.

Figure 9A:
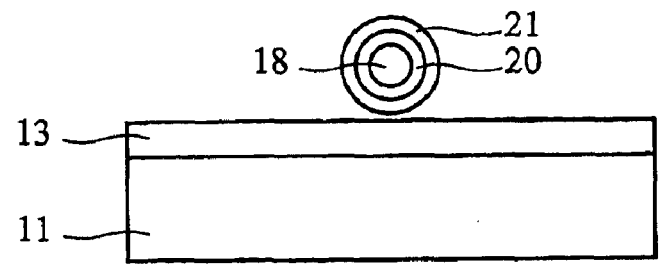
Figure 9B:
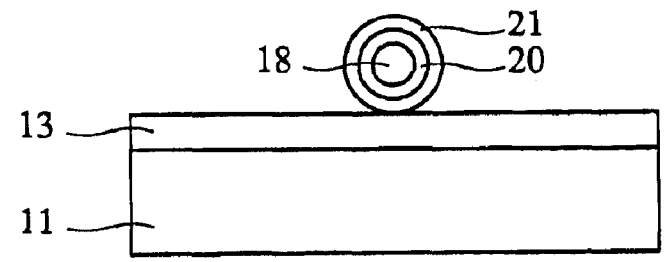
Figure 9C:
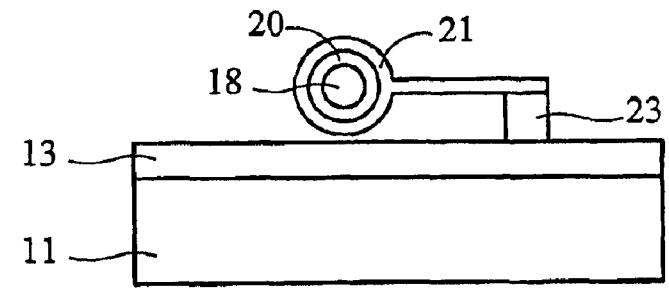

Referring now to FIG. 9a, there is shown a schematic cross-sectional view of the fabrication on FIG. 8 wherein a gate electrode (21) has now been formed over the gate dielectric (20), completely surrounding it circumferentially. The gate electrode can be formed of a highly doped polysilicon or of a metal. It is preferably deposited by CVD to a thickness of between approximately 50 and 2000 angstroms and is shaped by patterning and etching. As mentioned above, the electrode can be suspended above the oxide layer (13) as shown in this figure, or it can touch the oxide layer and be supported by it (FIG. 9b), or it can be extended out from the channel and rest on a silicon island (23)(FIG. 9c).

As is understood by a person skilled in the art, the preferred embodiment of the present invention is illustrative of the present invention rather than limiting of the present invention. Revisions and modifications may be made to methods, materials, structures and dimensions employed in the present method for forming a horizontal surrounding gate MOSFET, while still providing a method for forming a horizontal surrounding gate MOSFET, in accord with the spirit and scope of the present invention as defined by the appended claims.

What is claimed is:

1. A horizontal surrounding gate MOSFET comprising:
    a monolithic structure of semiconductor material formed on a semiconductor substrate, the structure comprising a similarly doped source portion and drain portion disposed at either end of an oppositely doped central portion which is a substantially cylindrical channel portion disposed between said source and drain portions and supported by them above the substrate, wherein the channel portion horizontally extends over the substrate such that the channel portion is horizontally disposed between the source and drain;
    a gate dielectric layer formed on the surface of said channel portion; and
    a gate electrode formed on the dielectric layer, said electrode completely surrounding the channel circumferentially.

2. The MOSFET of claim 1 wherein the gate electrode does not contact the substrate.

3. The MOSFET of claim 1 wherein the gate electrode extends from the channel portion and rests on an island formed over the substrate.

4. The MOSFET of claim 3 wherein the island is a silicon island.

5. The MOSFET of claim 1 wherein the gate electrode is supported by a laterally disposed structure on the substrate.

* * * * *